United States Patent
Teng

(10) Patent No.: US 7,358,034 B2
(45) Date of Patent: *Apr. 15, 2008

(54) METHOD OF PROCESSING ON-PRESS DEVELOPABLE LITHOGRAPHIC PRINTING PLATE

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 275 days.

This patent is subject to a terminal disclaimer.

(21) Appl. No.: 11/356,911

(22) Filed: Feb. 18, 2006

(65) Prior Publication Data

US 2007/0193460 A1    Aug. 23, 2007

(51) Int. Cl.
- *G03C 1/00* (2006.01)
- *G03C 5/18* (2006.01)
- *G03C 5/26* (2006.01)
- *B41N 1/18* (2006.01)
- *B41M 5/00* (2006.01)

(52) U.S. Cl. .................. 430/302; 101/456; 101/463.1; 430/270.1; 430/271.1; 430/284.1; 430/434; 430/435

(58) Field of Classification Search ........ 430/302–303, 430/57–58, 271.1–283; 101/456, 463.1
See application file for complete search history.

(56) References Cited

U.S. PATENT DOCUMENTS

| | | | |
|---|---|---|---|
| 5,607,816 A | 3/1997 | Fitzgerald et al. ....... | 430/271.1 |
| 5,910,395 A | 6/1999 | Li et al. ...................... | 430/302 |
| 6,014,929 A | 1/2000 | Teng ........................... | 101/456 |
| 6,136,503 A | 10/2000 | Zheng et al. ............. | 430/270.1 |
| 6,153,356 A | 11/2000 | Urano et al. .............. | 430/281.1 |
| 6,232,038 B1 | 5/2001 | Takasaki et al. .......... | 430/281.1 |
| 6,309,792 B1 | 10/2001 | Hauck et al. ............. | 430/270.1 |
| 6,331,375 B1 | 12/2001 | Kawamura et al. ...... | 430/270.1 |
| 6,482,571 B1 | 11/2002 | Teng ........................... | 430/302 |
| 6,576,401 B2 | 6/2003 | Teng ........................... | 430/303 |
| 6,689,537 B2 | 2/2004 | Urano et al. .............. | 430/273.1 |
| 6,740,464 B2 | 5/2004 | Maemoto .................... | 430/138 |
| 6,881,532 B2 | 4/2005 | Suzuki ....................... | 430/309 |
| 6,913,824 B2 * | 7/2005 | Culler et al. ................ | 428/401 |
| 7,213,516 B1 * | 5/2007 | Teng ........................... | 101/451 |
| 2003/0186165 A1 | 10/2003 | Gries et al. .............. | 430/281.1 |

\* cited by examiner

Primary Examiner—Dah-Wei Yuan
Assistant Examiner—Chanceity N Robinson

(57) ABSTRACT

A method of deactivating and on-press developing an exposed lithographic printing plate is disclosed. The plate comprises on a substrate a photosensitive layer developable with ink and/or fountain solution and capable of hardening upon exposure to a radiation. The plate is exposed with the radiation, deactivated, and then on-press developed with ink and/or fountain solution. The deactivation of the exposed plate allows the handling of the plate under regular office light or any other light without causing the hardening of the non-exposed areas of the photosensitive layer.

27 Claims, No Drawings

METHOD OF PROCESSING ON-PRESS DEVELOPABLE LITHOGRAPHIC PRINTING PLATE

FIELD OF THE INVENTION

This invention relates to lithographic printing plate. More particularly, it relates to a method of deactivating a photosensitive lithographic plate after imagewise exposure and before on press development.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate.

Conventionally, the plate is exposed with an actinic light (usually an ultraviolet light from a lamp) through a separate photomask film having predetermined imaging pattern that is placed between the light source and the plate. Laser sources have been increasingly used to imagewise expose a printing plate that is sensitized to a corresponding laser wavelength, allowing the elimination of the photomask film. Suitable lasers include, for example, infrared lasers (such as laser diode of about 830 nm and NdYAG laser of about 1064 nm), visible lasers (such as frequency-doubled NdYAG laser of about 532 nm and violet laser diode of about 405 nm), and ultraviolet laser (such as ultraviolet laser diode of about 370 nm).

The exposed plate is usually developed with a liquid developer to bare the substrate in the non-hardened or solubilized areas. Such a process is cumbersome and generates hazardous wastes.

On-press developable lithographic printing plates have been disclosed in the literature. Such plates can be directly mounted on press after imagewise exposure to develop with ink and/or fountain solution during the initial prints and then to print out regular printed sheets. No separate development process before mounting on press is needed, allowing the reduction of labor and the elimination of hazardous waste. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,482,571.

An on-press developable plate is designed to be developed on a lithographic printing press in a pressroom, which is generally under regular office light (white light). The imagewise exposed plate typically sees the white light during the handling and on-press development. Therefore, the plate must be designed so that it is stable enough under regular office light within a certain time period (such as 30 minutes). Plates that are not stable enough under regular office light are not suitable for on-press development application in the common pressroom lighting condition. Such an office light stability requirement makes it very difficult to design an on-press developable plate with fast photospeed or suitable for laser exposure.

There has been a desire to develop a method that would eliminate the office light stability requirement of an on-press developable plate after imagewise exposure and before and during on-press development.

SUMMARY OF THE INVENTION

According to the present invention, there has been provided a method of lithographically printing images on a receiving medium, comprising in order:

(a) providing a lithographic plate comprising (i) a substrate and (ii) a photosensitive layer capable of hardening upon exposure to a radiation having a wavelength selected from 200 to 1200 nm and soluble or dispersible in ink and/or fountain solution, wherein said photosensitive layer exhibits an affinity or aversion substantially opposite to the affinity or aversion of said substrate to at least one printing liquid selected from the group consisting of ink and an abhesive fluid for ink;

(b) imagewise exposing said plate with said radiation to cause hardening of the photosensitive layer in the exposed areas;

(c) overall applying a deactivating agent to the exposed plate to deactivate the photosensitive layer; and (d) contacting said deactivated plate with ink and/or fountain solution on a lithographic press to remove the photosensitive layer in the non-hardened areas and to lithographically print images from said plate to the receiving medium.

In one embodiment of the invention, the above steps (a) to (c) are performed with the plate under lightings (including darkness) that will not cause hardening of the photosensitive layer, and said step (d) is performed under a lighting that will cause hardening of the non-deactivated photosensitive layer. The deactivation of step (c) allows the plate to be handled and on-press developed under a lighting which is not safe (causing hardening) to the original, non-deactivated photosensitive layer.

In another embodiment of the invention, the above steps (a) to (c) are performed with the plate under lightings that contain no or substantially no radiation below a wavelength selected from 400 to 650 nm (such as 400, 450, 500, 550, or 600 nm), or in the dark or substantially dark; and said step (d) is performed under a white light (which can be a white fluorescence light, incandescent light, sunlight, or any other office white light). Here, the steps (a) to (c) can be under different or the same lightings (including darkness).

In yet another embodiment of the invention, the plate is under the same room lighting for steps (a) to (d), and the total exposure time to the room lighting before the plate being deactivated (steps a to c) is short enough so that the non-imagewise-exposed areas of the plate are not hardened (still capable of development with ink and/or fountain solution in step (d)). The room lighting can be any light that will cause hardening of the photosensitive layer if exposed to the lighting for more than a certain amount of time (such as 20 minutes). Preferably, the room lighting is a white light.

The above method is suitable for on-press developable plates designed for any radiation source. However, it is particularly suitable for laser sensitive on-press developable plates because such plates generally have higher photospeed due to the limited power of the lasers.

DETAILED DESCRIPTION OF THE PREFERRED EMBODIMENTS

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric support. A surface coating may be coated to achieve desired surface properties. For wet plate, the substrate should have a hydrophilic surface (for oleophilic photosensitive layer) or oleophilic surface (for hydrophilic photosensitive layer); commonly, a wet lithographic plate has a hydrophilic substrate and an oleophilic photosensitive layer. For waterless plate, the substrate should have an oleophilic surface (for oleophobic photosensitive layer) or oleophobic surface (for oleophilic photosensitive layer).

Particularly suitable hydrophilic substrate for a wet lithographic plate is an aluminum support that has been grained and anodized, preferably with further hydrophilic treatment. Surface graining can be achieved by mechanical graining or brushing, chemical etching, and/or AC electrochemical graining. The grained aluminum is typically treated with a basic or acid solution to remove the smut, and then subjected to an electrochemical anodization process utilizing an acid such as sulfuric acid and/or phosphoric acid. The roughened and anodized aluminum surface can be further treated with a hydrophilic material to form a hydrophilic barrier layer. Suitable hydrophilic materials include metal silicate such as sodium silicate, phosphate fluoride (formed from a solution containing sodium dihydrogen phosphate and sodium fluoride), phosphoric acid, and hydrophilic polymer such as polyvinyl phosphonic acid, polyacrylamide, polyacrylic acid, polybasic organic acid, copolymers of vinyl phosphonic acid and acrylamide. Polyvinyl phosphonic acid and its copolymers are preferred hydrophilic polymers. The hydrophilic material can be formed on the aluminum surface by thermal or electrochemical method. By thermal method, the grained and anodized aluminum passes through or is immersed for a certain time in a solution containing the hydrophilic material at a certain temperature including elevated and room temperature. By electrochemical method, a DC or AC electricity is applied to the aluminum while passing through or immersed in the solution containing the hydrophilic material. Processes for surface graining, anodization, and hydrophilic treatment of aluminum in lithographic printing plate application are well known in the art, and examples can be found in U.S. Pat. Nos. 2,714,066, 4,153,461, 4,399,021, 5,368,974, and 6,555,205.

For preparing lithographic printing plates of the current invention, any photosensitive layer is suitable which is capable of hardening upon exposure to a radiation having a wavelength selected from 200 to 1200 nm, and is soluble or dispersible in ink (for waterless plate) or in ink and/or fountain solution (for wet plate). Here hardening means becoming insoluble and non-dispersible in ink and/or fountain solution. Hardening is generally achieved through crosslinking or polymerization of the resins (polymers or monomers). The radiation can be a conventional light such as ultraviolet light from a lamp (which usually requires a photomask), or can be a laser (which directly images according to digital imaging information). Preferably, the photosensitive layer is sensitive to a laser and exposed with such laser. The photosensitive layer preferably has a coverage of from 100 to 4000 mg/m$^2$, and more preferably from 400 to 2000 mg/m$^2$.

Preferably, the photosensitive layer comprises a polymerizable monomer and an initiating system, optionally with addition of a polymeric binder. The initiating system generally comprises an initiator; an initiator and a sensitizing dye; or an initiator, a sensitizing dye and a hydrogen donor; depending on the specific photosensitive layer. Either one species (such as 1 initiator or 1 polymer) or more than one species of the same component type (such as 2 different initiators or 3 different monomers) can be added in the same photosensitive layer. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

In this patent, the term monomer includes both monomer and oligomer, and the term (meth)acrylate includes both acrylate and methacrylate (A monomer means a monomer or an oligomer, and a (meth)acrylate monomer means an acrylate monomer, a methacrylate monomer, or a monomer with both acrylate and methacrylate groups.). The term monomer to polymer weight ratio means the weight ratio of all the specific monomers to all the polymeric binders (which are solid film-forming polymers); liquid polymer such as nonionic surfactant is not considered polymeric binder and is not included in the monomer to polymer weight ratio calculation. The term "comprises a . . . " means "comprises at least one . . . "; for example, the term "comprising a monomer" means "comprising at least one monomer." The term yellow or red light means yellow light, red light, or any light with a color between yellow and red such as orange light. The term safe light means a light with a certain wavelength range being cut off, including yellow light or red light, so that it does not cause hardening of a certain photosensitive layer. The term white light means a white fluorescence light, white incandescence light, sunlight, or any regular office light.

Photosensitive materials useful as photosensitive layer of this invention include, for example, photosensitive compositions comprising a polymerizable monomer, an initiator, optionally a sensitizing dye, and optionally a polymeric binder.

Photosensitive materials useful in wet plates of this invention include, for example, photosensitive compositions comprising an oleophilic polymeric binder, a polymerizable monomer, an initiator, and optionally a sensitizing dye.

Photosensitive oleophobic materials useful in waterless plates of this invention include, for example, compositions comprising a monomer having perfluoroalkyl or polysiloxane groups and crosslinkable terminal groups, an initiator, and optionally a sensitizing dye.

Infrared laser sensitive materials useful for thermosensitive lithographic plates of this invention include, for example, thermosensitive compositions comprising a polymerizable monomer, an initiator, an infrared absorbing dye, and optionally a polymeric binder.

Visible or ultraviolet light sensitive materials useful for visible or ultraviolet laser sensitive plates of this invention include, for example, photosensitive compositions comprising a polymerizable monomer, an initiator, a visible or ultraviolet light sensitizing dye, and optionally a polymeric binder. A hydrogen donor is preferably added to accelerate the polymerization.

Polymeric binder for the photosensitive layer of this invention can be any solid film-forming polymer. The polymer may or may not have (meth)acrylate groups or other ethylenic groups (such as allyl groups). Examples of suitable polymers include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton.

Suitable free-radical polymerizable monomers include any monomer or oligomer with at least one ethylenically unsaturated group. Such monomers include monofuctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated(meth)acrylate; epoxylated(meth)acrylate; and oligomeric amine(meth)acrylates. The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth) acrylate groups, more preferably at least 4 (meth)acrylate groups, even more preferably at least 5 (meth)acrylate groups, and most preferably at least 6 (meth)acrylate groups.

Urethane(meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4 -trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri(meth)acrylate and pentaerythritol di(meth)acrylate monostearate. Various urethane (meth) acrylate monomers are described in U.S. Pat. No. 6,232,038 and U.S. Pat. Pub. No. 2002/0018962, and can be used as the urethane (meth)acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth) acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa(meth)acrylate, di(trimethylolpropane) tetra(meth)acrylate. Among the non-urethane (meth)acrylate monomers, non-urethane acrylate monomer is preferred.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene compounds such as bis($\eta^9$-2,4-cyclopentadien-1-yl)bis[2,6-d]fluoro-3-(1H-pyrrol-1-yl)phenyl)titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Infrared sensitizing dyes useful in the infrared sensitive photosensitive layer (also called thermosensitive layer) of this invention include any infrared absorbing dye effectively absorbing an infrared radiation having a wavelength of 750 to 1200 nm. It is preferable that the dye has an absorption maximum between the wavelengths of 780 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared laser sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm and capable of directly or indirectly causing polymerization of the monomers upon exposure to the corresponding laser. Usually, the visible or ultraviolet dye activates an initiator to cause the polymerization of the monomer upon exposure to a laser. Suitable visible or ultraviolet sensitive dyes include, for example, cyanine dyes; rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-diethylaminophenyl)benzothiazole, 2-(p-dimethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet laser sensitizing dye is added in the photosensitive layer preferably at 0.1 to 20% by weight of the photosensitive layer, more preferably 0.5 to 15%, and most preferably 1 to 10%.

The free radical polymerizable photosensitive composition of the present invention preferably contains a hydrogen-donor compound (also called hydrogen donor) as polymerization accelerator. Examples of the hydrogen-donor compound include compounds having a mercapto group such as 2-mercaptobenzothiazole, 2-mercaptobenzimidazole, 2-mercaptobenzoxazole and 3-mercapto-1,2,4-triazole, N,N-dialkyl benzoic alkyl ester, N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. More than one hydrogen donor compounds can be added.

Various surfactants can be added into the photosensitive layer to allow or enhance on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are particularly suitable. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

The deactivating agent can be any material that can deactivate the photo hardening capability of the photosensitive layer. It can be a solid or liquid organic or inorganic compound, such as organic or inorganic acid, base, oxidizer, or reducer. The deactivating agent can be applied from a solution (based on water or organic solvent) to the photosensitive layer (with or without overcoat). Preferably, the deactivating agent is soluble in water and is applied from an aqueous solution. A water-soluble organic solvent, such as ethylene glycol, can be added into the aqueous solution. Certain additives, such as dye, dispersed pigment, bactericide, stabilizer, reducer, thickening agent, and surfactant, can be added. For free radical polymerizable photosensitive layer, the deactivating agent can be a compound that can react with a component of the free radical initiating system (such as initiator, sensitizing dye, or hydrogen donor).

The solution containing the deactivating agent can be applied to the photosensitive layer of the plate through any means, such as spray, dipping, roller coating, slot coating, etc. For plate with an overcoat, the deactivating solution can be applied with or without the overcoat being removed first. When the overcoat is not removed before applying the deactivating solution, the deactivating solution may penetrate through the overcoat without removing the overcoat, or partially or completely remove the overcoat.

For photosensitive layer having an amine group in the initiator, sensitizing dye, or hydrogen donor, an acid compound (including organic acid and inorganic acid) can be used as the deactivating agent. Suitable organic acids include, for example, organic compounds having at lease one carboxylic acid group, a sulfonic acid group, or phosphonic acid group. Suitable inorganic acids include, for example, phosphoric acid, boric acid, and hydrochloride acid. Preferred acids are those with moderate acidity, such as carboxylic acid-functional organic compounds, phosphoric acid, and boric acid. Water-soluble organic compounds having at least one carboxylic acid group are preferred organic acids. Suitable organic acids include, for example, citric acid, acetic acid, salicylic acid, glycolic acid, malic acid, and lacetic acid. Citric acid and malic acid are particularly suitable because they are widely used natural organic acids and are non-hazardous to the environment. The acid is preferably applied as aqueous solution to deactivate the photosensitive layer. When strong acid (such as hydrochloride acid) is used as deactivating agent, it is preferably diluted to low concentration (such as less than 0.5%, preferably less than 0.1% by weight) in an aqueous solution to apply to the plate so that it does not damage the plate or cause safety problem.

Alkaline compound can also be used as the deactivating agent for certain free radical polymerizable photosensitive layer because it can react with certain free radical initiating system (initiator, sensitizing dye, or hydrogen donor). For example, an alkaline compound can react with an ionic initiator such as an onium salt, an ionic sensitizing dye such as a cyanine dye, or a hydrogen donor having carboxylic acid or thiol group. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. Suitable water-soluble amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine. The alkaline compound is preferably applied as an aqueous solution to deactivate the photosensitive layer. When strong base (such as sodium hydroxide) is used as deactivating agent, it is preferably diluted to low concentration (such as less than 0.5%, preferably less than 0.1% by weight) in an aqueous solution so that it does not damage the plate or cause safety problem.

For plates with rough and/or porous surface capable of mechanical interlocking with a coating deposited thereon, a thin water-soluble interlayer can be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The photosensitive layer may be conformally coated onto a roughened substrate (for example, with Ra of larger than 0.4 microns) at thin coverage (for example, of less than 1.2 g/m$^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

A water soluble or dispersible overcoat can be coated on the photosensitive layer to, for example, improve the photospeed, surface durability, and/or on-press developability of the plate. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic micro particles (such as talc and polymer particles) can be added into the overcoat to, for example, reduce the tackiness or moisture sensitivity of the plate. The overcoat preferably has a coverage of from 0.001 to 4.0 g/m$^2$, more preferably from 0.01 to 2.0 g/m$^2$, and most preferably from 0.1 to 1.0 g/m$^2$.

In a preferred embodiment for the thermosensitive lithographic printing plate of this invention, the thermosensitive layer comprises a polymeric binder, a polymerizable ethylenically unsaturated monomer having at least one terminal ethylenic group, a free-radical initiator, and an infrared absorbing dye. Other additives such as surfactant, dye or pigment, exposure-indicating dye (such as leuco crystal violet, leucomalachite green, azobenzene, 4-phenylazo-diphenylamine, and methylene blue dyes), and free-radical stabilizer (such as methoxyhydroquinone) may be added. The monomer-to-polymer weight ratio is preferably at least 1.0, more preferably at least 1.5, and most preferably at least 2.0.

In another preferred embodiment for the thermosensitive lithographic printing plates of this invention, the thermosensitive layer comprises a polymeric binder, a urethane (meth) acrylate monomer having at least 4 (meth)acrylate groups, a free-radical initiator, and an infrared absorbing dye.

In a preferred embodiment for visible light sensitive lithographic printing plates of this invention, the photosensitive layer comprises a polymeric binder, a polymerizable ethylenically unsaturated monomer having at least one terminal ethylenic group, a free-radical initiator, and a visible sensitizing dye. A hydrogen donor is preferably added to increase the photospeed. Other additives such as surfactant, dye or pigment, exposure-indicating dye, and free-radical stabilizer may be added. The monomer-to-polymer weight ratio is preferably at least 1.0, more preferably at least 1.5, and most preferably at least 2.0.

In a preferred embodiment for violet or ultraviolet light sensitive lithographic printing plates of this invention, the photosensitive layer comprises a polymeric binder, a polymerizable ethylenically unsaturated monomer having at least one terminal ethylenic group, a free-radical initiator, and a violet or ultraviolet sensitizing dye. A hydrogen donor is preferably added to increase the photospeed. Other additives such as surfactant, dye or pigment, exposure-indicating dye, and free-radical stabilizer may be added. The monomer-to-polymer weight ratio is preferably at least 1.0, more preferably at least 1.5, and most preferably at least 2.0.

In another preferred embodiment for the violet or ultraviolet laser sensitive lithographic plates of this invention, the photosensitive layer comprises a polymeric binder, a monomer having at least 3 (meth)acrylate group, a hexaarylbiimidazole or titanocene compound, a dialkylaminobenzophenone compound, and a hydrogen donor compound. The monomer-to-polymer weight ratio is preferably at least 1.0, more preferably from 1.5 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet another preferred embodiment for the violet or ultraviolet laser sensitive lithographic plates of this invention, the photosensitive layer comprises a polymeric binder, a urethane monomer having at least 4 (meth)acrylate group, a hexaarylbiimidazole or titanocene compound, a dialkylaminobenzophenone compound, and a hydrogen donor compound. The monomer-to-polymer weight ratio is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane(meth)acrylate monomer can be added.

In further another preferred embodiment for the violet or ultraviolet laser sensitive lithographic plates of this invention, the photosensitive layer comprises a polymeric binder, a urethane monomer having at least 4 (meth)acrylate group, a non-urethane monomer having at least 4 (meth)acrylate groups, a hexaarylbiimidazole or titanocene compound, a dialkylaminobenzophenone compound, and a hydrogen donor compound. The weight ratio of the urethane (meth) acrylate monomer to the non-urethane (meth)acrylate monomer is preferably from 0.10 to 10.0, more preferably from 0.20 to 5.0, and most preferably from 0.30 to 3.0. The weight ratio for said monomers to the polymeric binders is preferably at least 0.5, more preferably from 1.0 to 6.0, even more preferably from 1.5 to 5.0, and most preferably from 2.0 to 4.0. A hexaarylbiimidazole compound is preferred among hexaarylbiimidazole and titanocene compounds. A preferred dialkylaminobenzophenone compound is a 4,4'-bis(dialkylamino)benzophenone compound.

On-press developable lithographic plates and the photosensitive layer compositions as described in U.S. Pat. Nos. 6,482,571, 6,576,401, 5,548,222, and 6,541,183, and U.S. patent application Ser. Nos. 10/720,882, 11/075,663, 11/175,518, 11/266,817, and 11/336,132, the entire disclosures of which are hereby incorporated by reference, can be used for the instant invention.

A hydrophilic or oleophilic micro particles may be added into the photosensitive layer to enhance, for example, the developability and non-tackiness of the plate. Suitable micro particles include polymer particles, talc, titanium dioxide, barium sulfate, silicone oxide and aluminum micro particles, with an average particle size of less than 10 microns, preferably less than 5 microns, more preferably less than 2 microns and most preferably less than 1 microns. A suitable particular dispersion is described in U.S. Pat. No. 6,071,675, the entire disclosure of which is hereby incorporated by reference.

The photosensitive layer should exhibit an affinity or aversion substantially opposite to the affinity or aversion of the substrate to at least one printing liquid selected from the group consisting of ink and an abhesive fluid for ink. For example, a wet plate can have a hydrophilic substrate and an oleophilic photosensitive layer, or can have an oleophilic substrate and a hydrophilic photosensitive layer; a waterless plate can have an oleophilic substrate and an oleophobic photosensitive layer, or can have an oleophobic substrate and an oleophilic photosensitive layer. An abhesive fluid for ink is a fluid that repels ink. Fountain solution is the most commonly used abhesive fluid for ink. A wet plate is printed on a wet press equipped with both ink and fountain solution, while a waterless plate is printed on a waterless press equipped with ink.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 500 mJ/cm$^2$, more preferably from 10 to 300 mJ/cm$^2$, and most preferably from 50 to 200 mJ/cm$^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively lower cost. The exposure dosage is preferably from 0.001 to 2 mJ/cm$^2$ (1 to 2000 µJ/cm$^2$), more preferably from 0.005 to 0.4 mJ/cm$^2$ (5 to 400 µJ/cm$^2$), and most preferably from 0.02 to 0.20 mJ/cm$^2$ (20 to 200 µJ/cm$^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.001 to 2 mJ/cm$^2$ (1 to 2000 µJ/cm$^2$), more preferably from 0.005 to 0.4 mJ/cm$^2$ (5 to 400 µJ/cm$^2$), and most preferably from 0.02 to 0.20 mJ/cm$^2$ (20 to 200 µJ/cm$^2$), depending on the sensitivity of the photosensitive layer.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The plate is preferably exposed on an exposure device, deactivated with a deactivating agent, and then mounted on press to develop with ink and/or fountain solution and then print out regular printed sheets. Preferably, the plate is under a safe light or in the dark during imagewise exposure and deactivation. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions, more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the on-press development and printing of the plate of this invention.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the photosensitive layer. Various fountain solution compositions are described in U.S. Pat. Nos. 4,030,417 and 4,764,213.

The laser exposed plate can be directly applied with a deactivating agent. Alternatively, the exposed plate can be heated to an elevated temperature (such as 50 to 200° C. for 1 to 600 seconds) to further harden the photosensitive layer in the laser exposed areas, before applied with a deactivating agent. The heat can be applied to the plate by any means, such as hot air, contacting the back of the plate with a heated material, exposing the back of the plate with a radiation such as an infrared radiation, exposing the front of the plate (having photosensitive layer) with a radiation which has different wavelength from the laser and does not cause hardening of the photosensitive layer.

After the deactivation process, the plate can be further applied with heat or forced hot air to dry off any water on the plate or to further harden the photosensitive layer in the hardened areas. In addition to forced hot air, non-heated air blow can be utilized to dry off the water.

For plate with a water soluble or dispersible overcoat, the plate can be rinsed with water or other aqueous solution, to remove the water soluble or dispersible overcoat after imagewise exposure and before on-press development. The plate can be rinsed with water before or after deactivation, preferably before deactivation. For plate applied with heat after laser exposure, the plate can be rinsed with water before or after the heating process, preferably after the heating process.

The laser exposure and deactivation of this invention are performed with the plate in the dark or under lightings that will not cause hardening of the photosensitive layer at least within a certain period of time required for the process (such as 20 minutes). Preferably, these are performed with the plate in the dark or under lightings that will not cause hardening of the photosensitive layer. More preferably, these are performed under lightings containing no or substantially no radiation below a wavelength selected from 400 to 650 nm (such as 500 nm), or in the dark or substantially dark; most preferably under lightings containing no radiation below a wavelength selected from 400 to 650 nm, or in the dark. Such lighting is usually a yellow or red light. This includes a light that is from a fluorescence or incandescence lamp that is covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. The laser exposure and the deactivation can be performed with the plate under the same or different lightings (including darkness).

The on-press development can be performed under any lighting, preferably under a regular office white light or similar light (such as sunlight).

The term "substantially no radiation below a wavelength" means the intensity of the radiation below that wavelength is less than 1% of that for a regular 100-watt incandescence light (for home use, not focused) at a distance of 2 meters. The term "substantially dark" means the intensity of the radiation is less than 1% of that for a 100-watt incandescence light at a distance of 2 meters.

The lighting that contains no or substantially no radiation below a wavelength selected from 400 to 650 nm (usually as a yellow or red light) allows a working lighting for the operators. Alternatively, the plate can be handled automatically in the dark, including in a dark room or in a light-tight box of any shape. Preferably, during the handling before deactivation, the plate is in a lighting or lightings that contain no or substantially no radiation below a wavelength selected from 400 to 650 nm, or in the dark or substantially dark.

In one embodiment of the instant invention, both the laser exposure and deactivation are performed with the plate under a lighting that contains no or substantially no radiation below a wavelength selected from 400 to 650 nm; the lightings for the laser exposure and deactivation can be the same or different. In the second embodiment, the laser exposure is performed with the plate under a lighting that contains no or substantially no radiation below a wavelength selected from 400 to 650 nm and the deactivation is performed with the plate in the dark or substantially dark. In the third embodiment, the laser exposure is performed with the plate in the dark or substantially dark and the deactivation is performed with the plate under a lighting that contains no or substantially no radiation below a wavelength selected from 400 to 650 nm. In the fourth embodiment, both the laser exposure and the deactivation are performed with the plate in the dark or substantially dark.

The plate can be imaged on a laser imager and deactivated with a deactivating device in a room which has a lighting that contains no or substantially no radiation below a wavelength selected from 400 to 650 nm. The plate can be manually or automatically handled between the imager and deactivating device. The imager and deactivating device can stay open to the room light.

In another embodiment, the plate can be packaged in a light-tight cassette to feed to the exposure device that is designed to be light-tight for the plate, with the plate covered with light-tight covers. The plate can be automatically transferred to the deactivating device, with the plate staying within the light-tight covers all the time until it has been deactivated. Alternatively, the above automatic processes can be designed so that the light tight covers have some light-filtering windows which only passes radiation above a wavelength selected from 400 to 650 nm (such as 500 nm), so that the operator can visually monitor the plate during imaging and deactivation or off-press development.

The lighting (in addition to in the dark or substantially dark) used for the imaging, or deactivation can be any light that contains no or substantially no radiation below a wavelength selected from 400 to 650 nm. Such a cutoff wavelength can be 400, 450, 500, 550, 600, and 650 nm, or any wavelength between 400 and 650 nm, depending on the spectral sensitivity of the plate. Usually, such light is achieved by adding a filtering cover or coating to a white fluorescence or incandescence lamp to cut off the radiation at shorter wavelength. Such light includes yellow and red lights. Various yellow and red lights are commercially available (such as from EncapSulite International and General Electric), and can be used for the instant invention.

This invention is further illustrated by the following non-limiting examples of its practice.

EXAMPLES 1-3

An electrochemically grained, anodized, and polyvinylphosphonic acid treated aluminum sheet was first coated with a 0.1% aqueous solution of polyvinyl alcohol (Airvol 540, from Air Products) with a #6 Meyer rod, followed by drying in an oven at 100° C. for 2 min. The polyvinyl alcohol coated substrate was further coated with the photosensitive layer formulation PS-1 with a #8 Meyer rod, followed by drying in an oven at 90° C. for 2 min.

| PS-1 | |
|---|---|
| Component | Weight ratios |
| Neocryl B-728 (Polymer from Zeneca) | 2.75 |
| DPHA (Acrylic monomer from UCB Chemicals) | 6.56 |
| Pluronic L43 (Nonionic surfactant from BASF) | 0.56 |
| 2,2-Bis(2-chlorophenyl)-4,4',5,5'-tetraphenyl-1,1'-biimidazole | 1.21 |
| 4,4'-Bis(diethylamino)benzophenone | 0.77 |
| 2-Mercaptobenzoxazole | 0.15 |
| 2-Butanone | 88.00 |

The photosensitive layer coated plate was further coated with a water-soluble overcoat OC-1 using a #6 Meyer rod, followed by drying in an oven at 100° C. for 2 min. All the coatings were performed under a red light and the plate was then stored in a light tight box.

| OC-1 | |
|---|---|
| Component | Weight (g) |
| Airvol 203 (polyvinyl alcohol from Air Products) | 4.84 |
| Silwet 7604 (Surfactant from Union Carbide) | 0.02 |
| Triton X-100 (Surfactant from www.chemistrystore.com) | 0.14 |
| Water | 95.00 |

The plate was exposed with a violet plate imager equipped with a 60 mw violet laser diode emitting at about 405 nm (MAKO-8 from ECRM) for a dosage of about 90 $\mu J/cm^2$. The plate was imaged in an orange light room (with Fuji Yellow FV30 lights from Encapsulite), and was kept in a light tight box before and after imaging.

The laser exposed plate was cut into 3 pieces under red light. The first piece was treated with a 5% citric acid aqueous solution by dipping in the solution for 10 seconds. The second piece was rinsed with water by dipping in water for 5 seconds to remove the overcoat. The third piece was not treated. The treatments were performed under red light.

Each of the treated plates was tested on a wet lithographic press (AB Dick 360) under office white fluorescence light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 1.

TABLE 1

| Treatment of the plate | Background at 20 impressions | Background at 200 impressions | Inking in imaging areas |
| --- | --- | --- | --- |
| Dip in a 5% citric acid aqueous solution | Clean | Clean | Good |
| Rinse with water | Toning | Toning | Good |
| No treatment | Inked | Inked | Good |

I claim:

1. A method of lithographically printing images on a receiving medium, comprising in order:
   (a) providing a lithographic plate comprising (i) a substrate and (ii) a photosensitive layer capable of hardening upon exposure to a radiation having a wavelength selected from 200 to 1200 nm and soluble or dispersible in ink and/or fountain solution, wherein said photosensitive layer exhibits an affinity or aversion substantially opposite to the affinity or aversion of said substrate to at least one printing liquid selected from the group consisting of ink and an abhesive fluid for ink;
   (b) imagewise exposing said plate with said radiation to cause hardening of the photosensitive layer in the exposed areas;
   (c) applying a deactivating agent to said exposed plate to deactivate the photosensitive layer; and
   (d) contacting said deactivated plate with ink and/or fountain solution on a lithographic press to remove the photosensitive layer in the non-hardened areas and to lithographically print images from said plate to the receiving medium.

2. The method of claim 1 wherein said steps (a) to (c) are performed with the plate under lightings (including darkness) that will not cause hardening of the photosensitive layer, and said step (d) is performed under a lighting that will cause hardening of the non-deactivated photosensitive layer.

3. The method of claim 1 wherein said steps (a) to (c) are performed with the plate under lightings that contain no or substantially no radiation below a wavelength selected from 400 to 650 nm, or in the dark or substantially dark; and said step (d) is performed under a white light.

4. The method of claim 1 wherein said plate is under the same room lighting for said steps (a) to (d), said photosensitive layer in the non-imagewise-exposed areas is incapable of hardening under said room lighting within a certain amount of time and is capable of hardening under said room lighting for more than said amount of time, and the total exposure time to the said room lighting before the plate being deactivated is shorter than said amount of time so that the non-imagewise-exposed areas of the plate are not hardened.

5. The method of claim 1 wherein said deactivating agent is applied from an aqueous solution.

6. The method of claim 1 wherein said deactivating agent is applied from an organic solvent based solution.

7. The method of claim 1 wherein said deactivating agent is a liquid organic compound and is applied directly.

8. The method of claim 1 wherein said deactivating agent is applied by passing the plate through a device that delivers the deactivating agent to the plate.

9. The method of claim 1 wherein said plate is imagewise exposed on an imaging device and then automatically transferred to a deactivating device for applying a deactivating agent.

10. The method of claim 1 wherein said plate is heated to an elevated temperature of 50 to 200° C. for 1 to 600 seconds after said laser exposure (step b) and before said deactivation (step c).

11. The method of claim 1 wherein said photosensitive layer comprises a free radical polymerizable monomer, a free radical initiator, and a sensitizing dye.

12. The method of claim 1 wherein said plate further comprises a water soluble or dispersible overcoat.

13. The method of claim 1 wherein said radiation is a violet or ultraviolet laser having a wavelength selected from 300 to 430 nm and said plate is exposed at a dosage of from 5 to 400 $\mu J/cm^2$ (0.005 to 0.400 $mJ/cm^2$).

14. The method of claim 1 wherein said radiation is an infrared laser having a wavelength selected from 750 to 1100 nm.

15. The method of claim 1 wherein said photosensitive layer comprises a polymeric binder, a polymerizable ethylenically unsaturated monomer having at least one terminal ethylenic group, a free-radical initiator, and a violet or ultraviolet sensitizing dye; and said laser is a violet or ultraviolet laser having a wavelength selected from 300 to 430 nm.

16. The method of claim 1 wherein said photosensitive layer comprises a polymeric binder, a polymerizable ethylenically unsaturated monomer having at least one terminat ethylenic group, a free-radical initiator, and an infrared absorbing dye; and said laser is an infrared laser having a wavelength selected from 750 to 1100 nm.

17. The method of claim 1 wherein said photosensitive layer further comprises a nonionic surfactant.

18. The method of claim 1 wherein said plate is applied with heat or forced hot air to dry off any water or to further harden the photosensitive layer in the hardened areas after said deactivation and before said on-press development.

19. The method of claim 4 wherein said room lighting is a white light.

20. The method of claim 4 wherein said amount of time is 20 minutes.

21. The method of claim 5 wherein said deactivating agent is an alkaline compound which can react with one or more compounds in the photosensitive layer.

22. The method of claim 5 wherein said deactivating agent is an acid compound which can react with one or more compounds in the photosensitive layer.

23. The method of claim 5 wherein said deactivating agent is a water-soluble organic compound having at least one carboxylic acid groups.

24. The method of claim 11 wherein said photosensitive layer further comprises a hydrogen-donor compound.

25. The method of claim 12 wherein said plate is rinsed with water to remove the overcoat after the laser exposure (step b) and before the deactivation (step c).

26. The method of claim 12 wherein said plate is rinsed with water to remove the overcoat after the deactivation (step c) and before the on-press development (step d).

27. The method of claim 12 wherein said overcoat is partially or completely removed by an aqueous solution containing the deactivating agent during the deactivation (step c).

* * * * *